(12) United States Patent
Nitta et al.

(10) Patent No.: US 6,258,617 B1
(45) Date of Patent: *Jul. 10, 2001

(54) METHOD OF MANUFACTURING BLUE LIGHT EMITTING ELEMENT

(75) Inventors: Koichi Nitta; Hidetoshi Fujimoto; Masayuki Ishikawa, all of Kanagawa-ken (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/817,159

(22) PCT Filed: Aug. 30, 1996

(86) PCT No.: PCT/JP96/02434
§ 371 Date: Apr. 15, 1997
§ 102(e) Date: Apr. 15, 1997

(87) PCT Pub. No.: WO97/08759
PCT Pub. Date: Mar. 6, 1997

(30) Foreign Application Priority Data

Aug. 31, 1995 (JP) .............................................. P07-223993

(51) Int. Cl.[7] .......................... H01L 21/20; H01L 21/205; H01L 33/00; H01S 3/18
(52) U.S. Cl. .............................. 438/46; 438/47; 438/505; 438/508; 438/509; 438/930
(58) Field of Search .................................... 257/96, 97, 103; 372/43, 45; 438/46, 47, 479, 503, 505, 507, 509, 508, 930

(56) References Cited

U.S. PATENT DOCUMENTS

| | | | |
|---|---|---|---|
| 5,432,808 | * 7/1995 | Hatano | 372/45 |
| 5,583,879 | * 12/1996 | Yamazaki | 257/103 |
| 5,729,029 | * 3/1998 | Rudaz | 257/13 |
| 5,733,796 | * 3/1998 | Manabe et al. | |
| 5,742,628 | * 4/1998 | Fujii | 372/45 |
| 5,747,832 | * 5/1998 | Nakamura et al. | 257/103 |
| 5,751,013 | * 5/1998 | Kidoguchi et al. | 257/13 |
| 5,751,021 | * 5/1998 | Teraguchi | 257/103 |
| 5,753,939 | * 5/1998 | Sassa et al. | 257/94 |
| 5,804,834 | * 9/1998 | Shimoyama et al. | 257/22 |

FOREIGN PATENT DOCUMENTS

| | | | |
|---|---|---|---|
| 6-196755 | * 7/1994 | (JP) | 257/103 |
| 6-232451 | * 8/1994 | (JP) | 257/103 |
| 8-8460 | * 1/1996 | (JP) | 257/103 |
| 8-32113 | * 2/1996 | (JP) | 257/103 |
| 8-115880 | 5/1996 | (JP) . | |
| 8-125222 | 5/1996 | (JP) . | |

* cited by examiner

Primary Examiner—Mary Wilczewski
(74) Attorney, Agent, or Firm—Foley & Lardner

(57) ABSTRACT

A gallium-nitride-based blue light emitting element that is manufacturable through a small number of processes and a method of manufacturing the same are disclosed. A first gallium-nitride-based semiconductor layer containing impurities of a first conductivity type, a gallium-nitridebased semiconductor active layer that is substantially intrinsic, and a second gallium-nitride-based semiconductor layer containing impurities of a second conductivity type that is opposite to the first conductivity type are formed according to a thermal CVD method and are left in an inert gas to cool by themselves.

23 Claims, 4 Drawing Sheets

METHOD OF MANUFACTURING BLUE LIGHT EMITTING ELEMENT

TECHNICAL FIELD

The present invention relates to a blue light emitting element employing a gallium-nitride-based compound semiconductor and a method of manufacturing the same.

BACKGROUND ART

Gallium-nitride-based compound semiconductor such as GaN, InGaN, and GaAlN is drawing attention as material for fabricating blue light emitting diodes (LEDs) and blue laser diodes (LDs). This kind of compound semiconductor is capable. of emitting blue light of sufficient intensity hardly realized so far.

A blue light emitting element employing the gallium-nitride-based compound semiconductor is disclosed in, for example, Japanese Unexamined Patent Publication No. 4-321280. FIG. 7 shows the basic structure of a blue light emitting element 2 according to a prior art. On a sapphire substrate 200, a buffer layer 201 is formed. On the buffer layer 201, an n-type GaN semiconductor layer 202 and a p-type GaN semiconductor layer 203 are formed. Between the layers 202 and 203, there is a depletion layer to which carriers are injected to emit light.

The blue light emitting element is manufactured by growing crystals on a sapphire substrate according to a CVD method and by forming gallium nitride semiconductor layers on the substrate. The substrate is properly cut into chips. Each chip is connected to a wire frame, and wiring is made to complete a device.

A natural cooling process in an inert gas is disclosed in Japanese Unexamined Patent Publication No. 8-125222. To replace an atmospheric gas at room temperature with an inert gas, the disclosure vacuums a reactive tube under a high temperature. This high temperature may grow a substrate. When vacuuming the reactive tube, the grown crystals may evaporate. As a result, no grown crystals may be left, or the crystallized film may be thinned.

In the gallium-nitride-based blue light emitting element of the prior art, impurities in the semiconductor layers are not sufficiently activated. Accordingly, the prior art needs an after-treatment of thermal annealing.

The thermal annealing increases the number of processes and processing time. Since the gallium nitride semiconductor is exposed to a high temperature of 600° C. or over for a long time, nitrogen may escape from crystals and deteriorate surface homology. This results in changing semiconductor properties and deteriorating blue light emitting efficiency and yield.

DISCLOSURE OF INVENTION

An object of the present invention is to provide a gallium-nitride-based blue light emitting element involving a small number of manufacturing processes and a method of manufacturing the same.

Another object of the present invention is to provide a gallium-nitride-based blue light emitting element realizing high yield and a method of manufacturing the same.

Still another object of the present invention is to provide a gallium-nitride-based blue light emitting element proper for mass-production and a method of manufacturing the same.

Still another object of the present invention is to provide a gallium-nitride-based blue light emitting element realizing high-intensity light and low power consumption and a method of manufacturing the same.

In order to accomplish the objects, the present invention provides a blue light emitting element consisting of a first gallium-nitride-based semiconductor layer containing impurities of a first conductivity type, a gallium-nitride-based semiconductor active layer that is substantially intrinsic, and a second gallium-nitride-based semiconductor layer containing impurities of a second conductivity type that is opposite to the first conductivity type. The first and second gallium-nitride-based semiconductor layers and gallium-nitride-based semiconductor active layer are formed according to a thermal CVD method and are left in an inert gas to cool by themselves, so that seven percent or more of the impurities are activated.

The present invention also provides a method of manufacturing a blue light emitting element including the steps of forming, according to a thermal CVD method in a vacuum chamber, a first gallium-nitride-based semiconductor layer containing impurities of a first conductivity type, a gallium-nitride-based semiconductor active layer that is substantially intrinsic, and a second gallium-nitride-based semiconductor layer containing impurities of a second conductivity type that is opposite to the first conductivity type, and leaving the layers in an inert gas so that the layers may cool by themselves.

The present invention involves simple processes without thermal annealing and improves yield. The gallium-nitride-based compound semiconductor blue light emitting element of the present invention realizes high-intensity light with small power consumption.

BEST MODE FOR CARRYING OUT THE INVENTION

Figure 1:
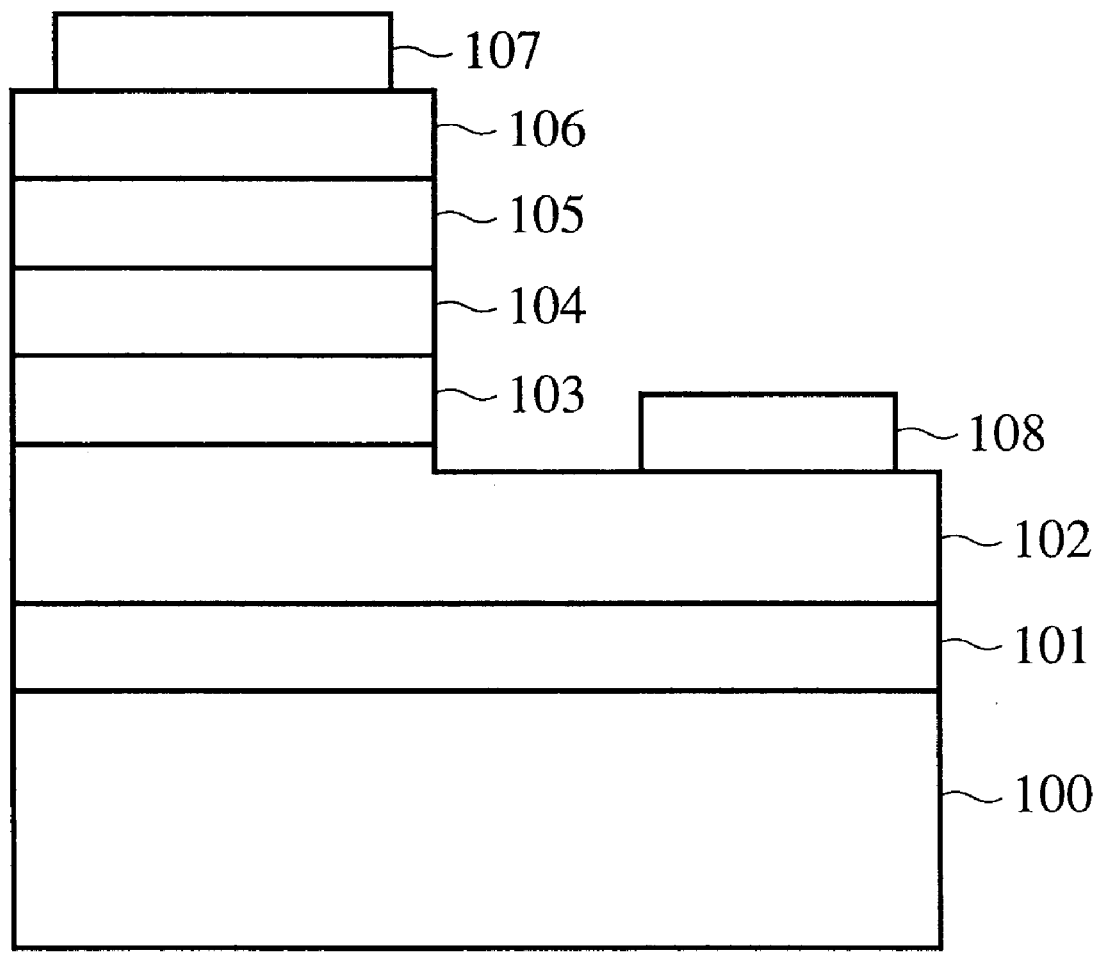
FIG. 1 is a sectional view showing the structure of a gallium-nitride-based compound semiconductor blue light emitting diode chip according to the present invention.

A method of manufacturing a gallium-nitride-based compound semiconductor blue light emitting diode according to the present invention will be explained with reference to FIG. 1.

The gallium-nitride-based compound semiconductor blue light emitting diode 1 has a sapphire substrate 100. On the substrate 100, a gallium-nitride-based semiconductor buffer layer 101 and a gallium-nitride-based n-type semiconductor contact layer 102 are formed. On the layer 102, a gallium-nitride-based n-type semiconductor clad layer 103, a gallium-nitride-based semiconductor active layer 104, a gallium-nitride-based p-type semiconductor clad layer 105, and a gallium-nitride-based p-type semiconductor contact layer 106 are formed. An electrode 108 is formed in contact with the layer 102. An electrode 107 is formed in contact with the layer 105.

The present invention employs InAlGaN compound semiconductor as the gallium-nitride-based semiconductor. This semiconductor is capable of emitting a wide range of blue light by adjusting the composition thereof. Examples of compositions will be explained. The composition of InAlGaN compound semiconductor is expressed as $In(x)Al(y)Ga(1-x-y)N$, where $0<=x<=1$, $0<=y<=1$, and $x+y<=1$.

The gallium-nitride-based n-type semiconductor buffer layer 101 relaxes lattice unconformity between the gallium-nitride-based semiconductor contact layer 102 and the sapphire substrate 100. Values for the parameters of $In(x)Al(y)Ga(1-x-y)N$ are, for example, $0<=x<=1$ and $0<=y<=1$, preferably, $0<=x<=0.5$ and $0<=y<=0.5$.

The gallium-nitride-based n-type semiconductor contact layer 102 serves a contact surface for the electrode 108. Values for the parameters of $In(x)Al(y)Ga(1-x-y)N$ for the layer 102 are, for example, $0<=x<=1$ and $0<=y<=1$, preferably, $0<=x<=0.3$ and $0<=y<=0.3$. To make the layer be of n-type, impurities such as silicon and selenium are added thereto at an impurity concentration of $6 \times 10^{18}$ cm$^{-3}$.

The gallium-nitride-based n-type semiconductor clad layer 103 forms the n side of a pin junction that forms a light emitting region. Values for the parameters of $In(x)Al(y)Ga(1-x-y)N$ are properly adjusted according to a required wavelength of light and are, for example, $0<=x<=1$ and $0<=y<=1$, preferably, $0<=x<=0.3$ and $0.1<=y<=1$. To make the layer be of n-type, impurities such as silicon and selenium are added thereto at an impurity concentration of $3 \times 10^{18}$ cm$^{-3}$.

The gallium-nitride-based semiconductor active layer 104 is substantially an intrinsic semiconductor layer that forms a main part of the light emitting region. Values for the parameters of $In(x)Al(y)Ga(1-x-y)N$ are properly adjusted according to a required wavelength of light and are, for example, $0<=x<=1$ and $0<=y<=1$, preferably, $0<=x<=0.6$ and $0<=y<=0.5$.

The gallium-nitride-based p-type semiconductor clad layer 105 forms the p side of the pin junction that forms the light emitting region. Values for the parameters of $In(x)Al(y)Ga(1-x-y)N$ are properly adjusted according to a required wavelength of light and the gallium-nitride-based n-type semiconductor clad layer 103 and gallium-nitride-based semiconductor active layer 104 and-are, for example, $0<=x<=1$ and $0<=y<=1$, preferably, $0<=x<=0.3$ and $0.1<=y<=1.0$. To make the layer be of p-type, impurities such as magnesium, beryllium, and zinc are added thereto at an impurity concentration of $3 \times 10^{18}$ cm$^{-3}$.

The gallium-nitride-based p-type semiconductor contact layer 106 serves a contact surface for the electrode 107. Values for the parameters of $In(x)Al(y)Ga(1-x-y)N$ are, for example, $0<=x<=1$ and $0<=y<=1$, preferably, $0<=x<=0.3$ and $0<=y<=0.3$. To make the layer be of p-type, impurities such as magnesium, beryllium, and zinc are added thereto at an impurity concentration of $8 \times 10^{18}$ cm$^{-3}$.

The electrode 107 is a transparent electrode with respect to the gallium-nitride-based semiconductor active layer 104. More precisely, it is a compound of metal such as ITO (indium tin oxide) and oxygen, or it may be a very thin film of metal such as Al and Ni.

The other electrode 108 is not necessarily transparent. It may be made of metal such as Ti, Al, and Ni.

The values mentioned above for the parameters of $In(x)Al(y)Ga(1-x-y)N$ are set so that the band gap of each of the gallium-nitride-based n-type semiconductor clad layer 103 and gallium-nitride-based p-type semiconductor clad layer 105 is larger than that of the gallium-nitride-based semiconductor active layer 104. This results in increasing the amount of carriers injected into the layer 104, to further improve the intensity of emitted light.

Figure 2:
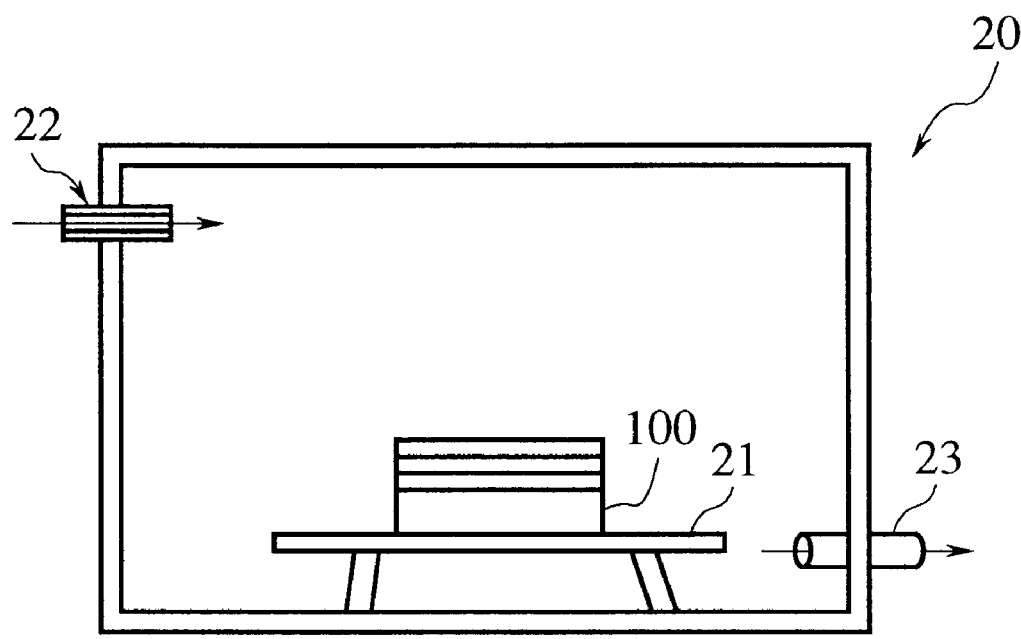
FIG. 2 is a schematic view showing a CVD apparatus for forming a gallium-nitride-based compound semiconductor blue light emitting diode chip according to the present invention.

These gallium-nitride-based semiconductor layers are formed on the sapphire substrate according to, for example, the thermal CVD method. FIG. 2 shows a CVD apparatus. This apparatus has a vacuum chamber 20, a substrate holder 21 disposed in the chamber, a reactive gas introducing pipe 22, an evacuation pipe 23, and a high-frequency coil (not shown) for heating a substrate set on the holder 21.

At first, a sapphire substrate 100 is set on the substrate holder 21. The vacuum chamber 20 is evacuated from 760 to 1 Torr. Then, high-frequency heating is started, and a reactive gas containing organic metal is introduced. The reactive gas may contain $Ga(CH_3)_3$, $In(CH_3)_3$, $Al(CH_3)_3$, and $NH_3$ and is introduced with a carrier gas containing hydrogen and nitrogen. A reaction pressure is about 760 Torr.

In this way, gallium-nitride-based semiconductor is formed. The composition of the reactive gas is properly changed to adjust the composition of each layer to form. Impurities are added by properly introducing $SiH_4$ and $CP_2Mg$.

Figure 3:
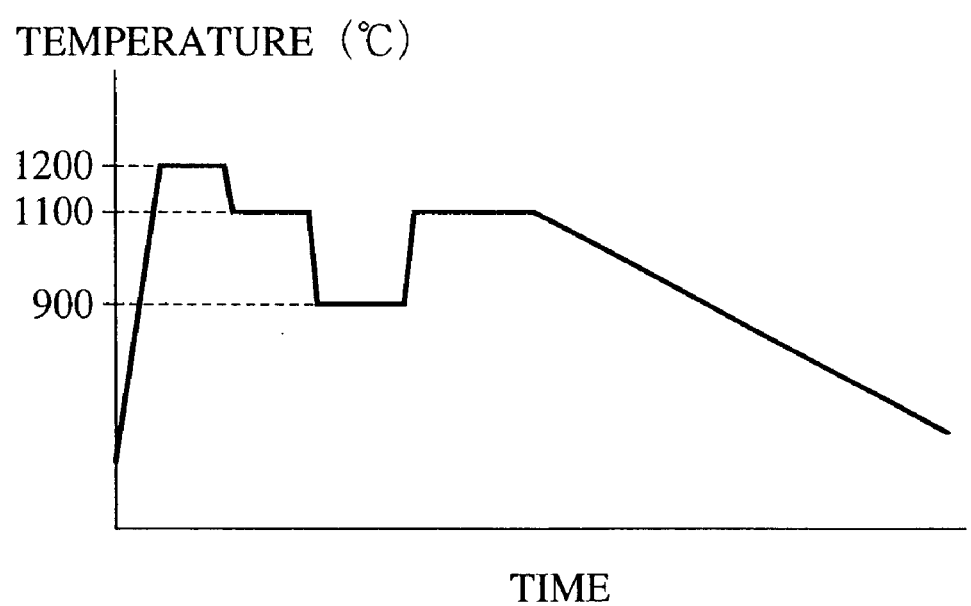
FIG. 3 is a graph showing temperature changes when manufacturing a gallium-nitride-based compound semiconductor blue light emitting diode according to the present invention.

FIG. 3 shows temperature changes in the vacuum chamber 20 when forming the gallium-nitride-based semiconductor. The temperature of the substrate is increased to 1000° C. to 1400° C., for example, 1200° C. to form a gallium-nitride-based semiconductor buffer layer. The temperature is dropped by 50° C. to 200° C. down to 800° C. to 1200° C. For example, the temperature is dropped from 1200° C. to 1100° C. to form an n-type contact layer and an n-type clad layer by adding proper impurities. To form an active layer, the temperature is dropped by 300° C. to 600° C. For example, the temperature is dropped from 1100° C. to 900° C. to 600°0 C. Lastly, the temperature of the substrate is increased to the first temperature, for example, 1100° C. to form a p-type clad layer and a p-type contact layer, thereby completing the element.

The present invention completely replaces the reactive gas in the vacuum chamber 20 with an inert gas. The inert gas is preferably nitrogen, or may be He or Ar.

After the vacuum chamber 20 is filled with the inert gas, the pressure of the chamber is adjusted to 600 to 900 Torr, for example, 760 Torr. This state is maintained for two to three hours. Then, the temperature of the substrate drops to room temperature, for example, 25° C. The sapphire substrate is removed from the vacuum chamber 20.

The sapphire substrate removed from the vacuum chamber 20 is properly cut by diamond cutter into many chips. Each chip forms a blue light emitting element that emits light having sufficient intensity. Accordingly, there is no need of an after-treatment of thermal annealing.

Since there is no need of carrying out the after-treatment of thermal annealing on the sapphire substrate taken out of the vacuum chamber 20, the present invention simplifies manufacturing processes and shortens a manufacturing time. The intensity of light emitted from the produced element is higher than that of the prior art.

The reason of this will be explained. The prior art activates impurities by thermal annealing. Actual measurements on the prior art tell, however, only about one percent of the impurities are activated. The remaining 99 percent are not only useless but also interfering because they cause lattice defects to act as carrier traps. Namely, injected carriers are mostly trapped thereby and do not work to emit light.

On the other hand, actual measurements on the present invention tell seven percent or more, usually about 10 percent of injected carriers are activated. In this way, the present invention activates many carriers and reduces resistance to drop power consumption.

Figure 4:
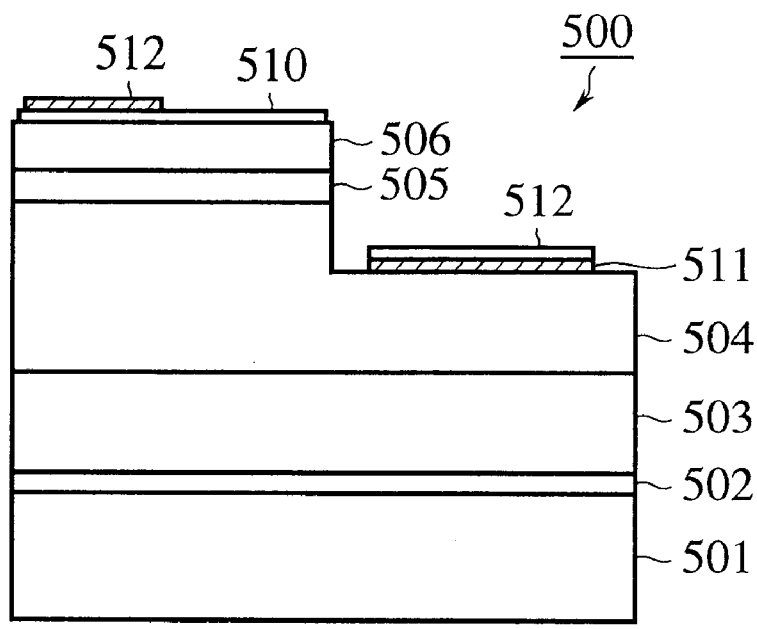
FIG. 4 shows a gallium-nitride-based compound semiconductor blue light emitting diode according to another embodiment of the present invention.

FIG. 4 is a sectional view showing the structure of a light emitting diode 500 according to another embodiment of the present invention. A method of manufacturing the light emitting diode 500 will be explained with reference to the figure.

A sapphire substrate 501 having a plane c as a principal plane is cleaned for organic and acid matter. The substrate is set on a susceptor to be heated in an MOCVD apparatus. Heating is carried out by a resistive or inductive heater.

Oxygen is supplied to the sapphire substrate 501 at a rate of 10 L/min, and the substrate is heat-treated at 1100° C. for about 10 minutes to remove process damage and oxides from the surface thereof.

The temperature is dropped to 550° C., and hydrogen at 15 L/min, nitrogen at 5 L/min, ammonia at 10 L/min, and TMG (trimethyl gallium) at 25 cc/min are supplied for four minutes to form a GaN buffer layer 502 of 30 nm thick.

The TMG is stopped, and the temperature is increased up to 1100° C. at a speed of 50° C./min or slower. If the temperature increasing speed is faster than 50° C., the surface of the buffer layer 502 will be roughened to form irregularities on the surface of a monocrystalline layer.

The temperature is kept at 1100° C., and hydrogen at 15 L/min, nitrogen at 5 L/min, ammonia at 10 L/min, and TMG at 100 cc/min are supplied to form a gallium-nitride-based monocrystalline semiconductor (GaN) buffer layer 503 of 1.8 $\mu$m thick.

The temperature is kept at 1100° C., and a silane gas is added at 10 cc/min for 130 minutes to the material gas, to form an n-type GaN contact injection layer 504 of 4 $\mu$m thick.

The TMG, silane gas, and hydrogen are stopped, and the temperature is dropped down to 780° C.

The temperature is kept at 780° C., and nitrogen at 20 L/min, hydrogen at 100 cc/min, ammonia at 10 L/min, TMG at 12 cc/min, TMI (trimethyl indium) at 150 cc/min, silane gas at 3 cc/min, and DMZ (dimethyl zinc) at 20 cc/min are supplied for six minutes to form an InGaN semiconductor active layer 505 of 0.2 $\mu$m thick serving as a light emitting layer.

Nitrogen at 20 L/min, hydrogen at 100 cc/min, and ammonia at 10 L/min are supplied, and the temperature is increased up to 1100° C.

The temperature is kept at 1100° C., and nitrogen at 20 L/min, hydrogen at 150 cc/min, ammonia at 10 L/min, TMG at 100 cc/min, and Cp2Mg (cyclopentadienyl magnesium) at 50 cc/min are supplied for 10 minutes to form a p-type GaN contact injection layer 506 of 0.3 $\mu$m thick.

Although the p-type layer is single in this embodiment, it is possible to separately form a contact layer and an injection layer. In this case, the contact layer is made from GaN and the injection layer from AlGaN so that the contact layer may have a higher carrier concentration than the injection layer.

The supplied gas is switched to nitrogen at 30 L/min, and the temperature is dropped to room temperature. As a result, the p-type GaN layer shows an activation ratio of 8% with respect to an Mg concentration of $3 \times 10^{19}$ cm$^{-3}$. The activation ratio is obtained by standardizing an acceptor concentration according to an Mg concentration. If the temperature is dropped to 400° C. with nitrogen at 20 L/min and ammonia at 10 L/min, and from 400° C. to room temperature with only nitrogen at 30 L/min, an activation ratio of 7% or greater is secured.

Generally, gallium-nitride-based semiconductor has the problem of denitrification. To prevent the problem, a compound that produces nitrogen ions instead of nitrogen itself is effective. This is the reason why ammonia is used in addition to nitrogen. If the ammonia is too much, hydrogen will reversely affect strongly. According to experiments, a preferable ratio of nitrogen to ammonia is 2:1.

The layer structure thus formed is heat-treated at 750° C. for one minute to further increase a carrier concentration in the p-type layer 506 and realize p-type crystals of $2 \times 10^{17}$ cm$^{-3}$.

The layer structure is patterned with the use of, for example, SiO$_2$ and is etched according to a reactive ion etching (RIE) method using Cl$_2$ and BCl$_3$ to expose a part of the n-type GaN layer 504.

An electrode for the p-type layer 506 is formed by depositing Ni for 20 nm and gold for 400 nm (510 in FIG. 4) according to a known vacuum deposition method and spattering method. An electrode for the n-type layer 504 is formed by depositing Ti for 20 nm and gold for 400 nm (511 in FIG. 4). The electrode for the p-type layer may be not only the laminated structure of Ni/Au but also a monolayer of Pd, Ti, Pt, or In, a laminated structure thereof with Ni and Au, or an alloy thereof. The electrode for the n-type layer may be made of Ti and Au, a monolayer of Al or In, a laminated structure including Ti and Au, or an alloy thereof.

On the p-type electrode 510, a protection film of SiO$_2$ is formed, to complete the element.

Although the embodiment relates to a light emitting diode, the gist of the present invention is the method of manufacturing a p-type layer. Accordingly, the present invention is applicable to a semiconductor laser employing GaN-based semiconductor.

Figure 5:
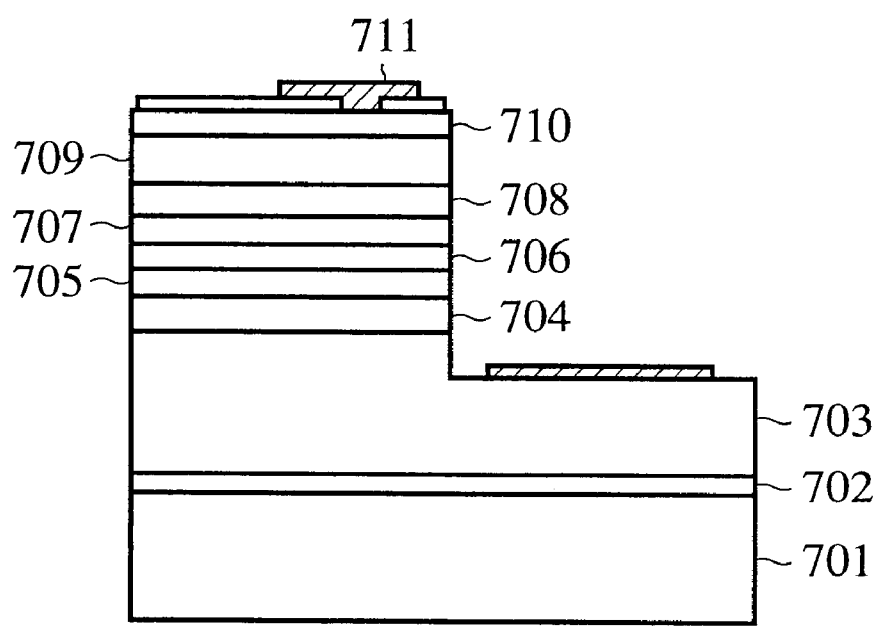
FIG. 5 shows a gallium-nitride-based compound semiconductor blue light emitting diode employing a semiconductor laser according to the present invention.

FIG. 5 shows the structure of a blue light emitting element employing such a semiconductor laser.

On a sapphire substrate 701, there are formed a gallium-nitride-based semiconductor buffer layer 702, a gallium-nitride-based n-type semiconductor contact layer 703, a gallium-nitride-based n-type semiconductor layer 704, a gallium-nitride-based n-type semiconductor clad layer 705, a gallium-nitride-based semiconductor active layer 706, a gallium-nitride-based p-type semiconductor clad layer 707, a gallium-nitride-based p-type semiconductor layer 708, a gallium-nitride-based p-type semiconductor layer 709, and a gallium-nitride-based p-type semiconductor contact layer 710.

Similar to the embodiment of FIG. 4, a part of the structure is etched according to the reactive ion etching method to partly expose the surface of the gallium-nitride-based n-type semiconductor contact layer 703. On the exposed surface, Ti, Au, Ti, and Au are laminated in this order to form an n-type electrode. The thicknesses there of are 200 µm, 4000 angstroms, 200 µm, and 1 µm, respectively. A p-type electrode 711 may be formed by laminating Pd, Ti, Pt, and Ti in this order. The thicknesses thereof are 200 µm, 4000 angstroms, 200 µm, and 1 µm, respectively.

The gallium-nitride-based semiconductor active layer 706 is made of In(x)Ga(1−x)N compound semiconductor having a quantum well structure. The layer is made by alternately laminating a film of 25 angstroms thick with x=0.05 and y=0.95 and a film of 25 angstroms thick with x=0.20 and y=0.80 about 20 times, to form a multilayer quantum well.

Any other gallium-nitride-based semiconductor layer is basically made of GaN. Examples of thicknesses are 70 µm for the sapphire substrate 701, 500 angstroms for the gallium-nitride-based semiconductor buffer layer 702, 4 µm for the gallium-nitride-based n-type semiconductor contact layer 703, 0.3 µm for the gallium-nitride-based n-type semiconductor layer 704, 0.2 µm for the gallium-nitride-based n-type semiconductor clad layer 705, 0.2 µm for the gallium-nitride-based p-type semiconductor clad layer 707, 0.3 µm for the gallium-nitride-based p-type semiconductor layer 708, 0.9 µm for the gallium-nitride-based p-type semiconductor layer 709, and 0.1 µm for the gallium-nitride-based p-type semiconductor contact layer 710.

Examples for impurity concentrations are $2 \times 10^{18}$ cm$^{-3}$ for the gallium-nitride-based n-type semiconductor contact layer 703, $5 \times 10^{17}$ cm$^{-3}$ for the gallium-nitride-based n-type semiconductor layer 704, $5 \times 10^{17}$ cm$^{-3}$ for the gallium-nitride-based n-type semiconductor clad layer 705, $5 \times 10^{17}$ cm$^{-3}$ for the gallium-nitride-based p-type semiconductor clad layer 707, $5 \times 10^{17}$ cm$^{-3}$ for the gallium-nitride-based p-type semiconductor layer 708, $3 \times 10^{18}$ cm$^{-3}$ for the gallium-nitride-based p-type semiconductor layer 709, and $2 \times 10^{19}$ cm$^{-3}$ for the gallium-nitride-based p-type semiconductor contact layer 710.

Figure 6:
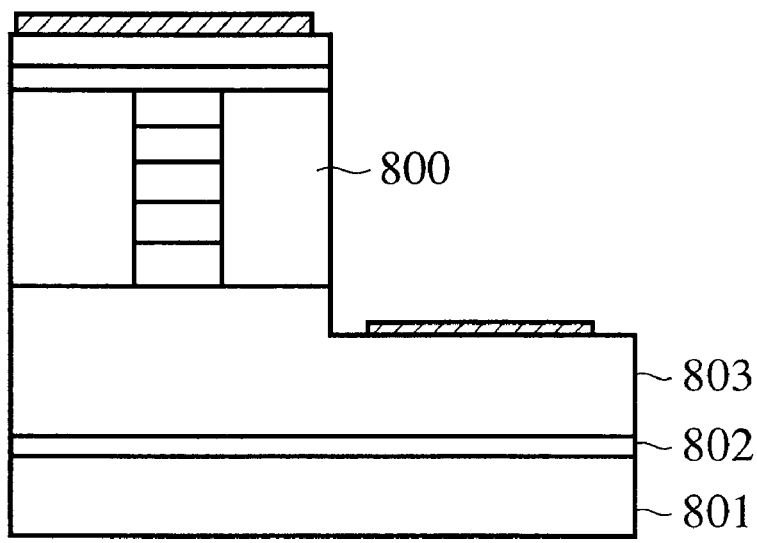
FIG. 6 shows another gallium-nitride-based semiconductor blue light emitting diode employing a semiconductor laser according to the present invention.
Figure 7:
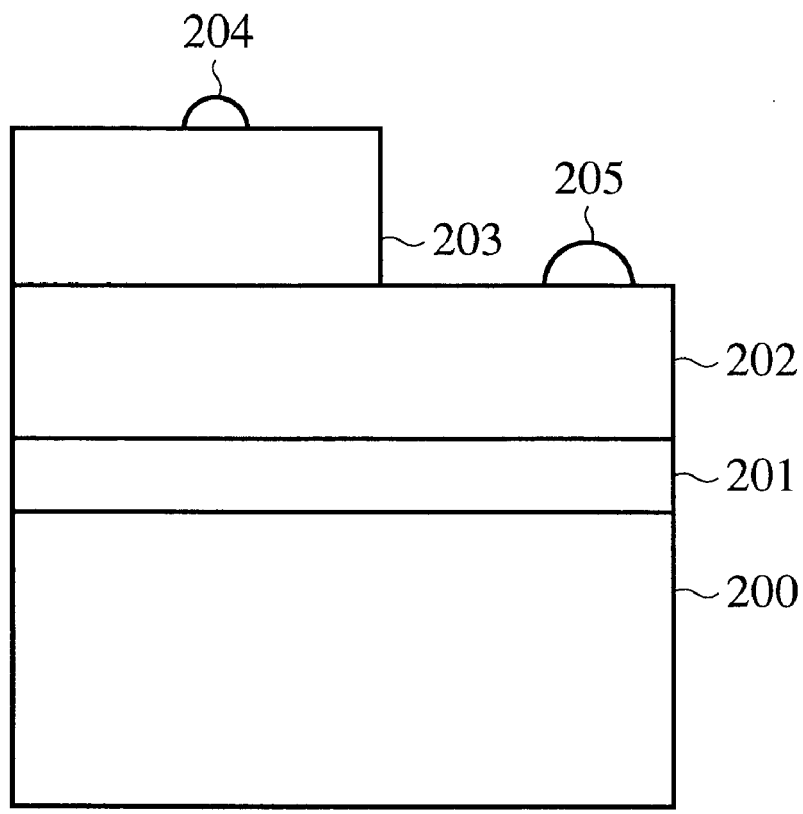
FIG. 7 is a sectional view showing the structure of a gallium-nitride-based compound semiconductor blue light emitting diode chip according to a prior art.

After the gallium-nitride-based p-type semiconductor layer 708 is formed, the reactive ion etching method may be used to etch up to the gallium-nitride-based n-type semiconductor contact layer 703. The etched part is filled with a GaN layer of high resistance with Zn, to limit a resonance part. An example of this kind of structure is shown in FIG. 6. A high-resistance GaN layer 800 contains Zn of $2 \times 10^{18}$ cm$^{-3}$ in concentration.

INDUSTRIAL APPLICABILITY

As explained above, the present invention provides a gallium-nitride-based compound semiconductor blue light emitting element that is manufactured through simple processes at high yield.

The gallium-nitride-based compound semiconductor blue light emitting element of the present invention provides high-intensity light at low power consumption.

What is claimed is:

1. A method of manufacturing a semiconductor device comprising the steps of:
   disposing a substrate in a vacuum chamber;
   heating said substrate to a temperature of from 1000 to 1400° C. to form a buffer layer of a gallium-nitride-based semiconductor;
   lowering said temperature of the substrate is by 50 to 200° C., after the completion of forming said gallium-nitride-based semiconductor buffer layer;
   forming an n-type contact layer of a gallium-nitride-based semiconductor and then forming an n-type cladding layer by introducing ammonia (NH$_3$), a gas comprising a Group III element and an n-type dopant gas in addition to a carrier gas comprising hydrogen (H$_2$) and an inert gas;
   stopping the introduction of the n-type dopant gas and lowering said temperature of the substrate by from 300 to 600° C. to form an active layer of a gallium-nitride-based semiconductor;
   heating said substrate to a temperature of from 1000 to 1400° C. to form a p-type cladding layer of a gallium-nitride-based semiconductor and then a p-type contact layer of a gallium-nitride-based semiconductor by introducing a p-type dopant gas in addition to said carrier gas, ammonia (NH$_3$) and said gas comprising the Group III element
   terminating the introduction of the gas containing the Group III element and increasing the flow rate of said inert gas immediately after the completion of the laminated structure of said p-type contact layer; and
   cooling said substrate by itself with said inert gas being introduced in the increased flow rate together with said ammonia.

2. The method of manufacturing a semiconductor device as claimed in claim 1 wherein said inert gas is introduced in excess of hydrogen, whose flow ratio to said inert gas is not smaller than 0.75%, in the step of forming said p-type cladding layer and said p-type contact layer.

3. The method of manufacturing a semiconductor device as claimed in claim 2 wherein at least one of said n-type contact layer, said the n-type cladding layer, said the active layer, said the p-type cladding layer and said the p-type contact layer is represented by formula In(x)Al(y)Ga(1−x−y)N(x+y≧1, 0≦x≦1, 0≦y≦1).

4. The method of manufacturing a semiconductor device as claimed in claim 2 wherein the step of cooling said substrate by itself comprises a step of adjusting the internal pressure of said vacuum chamber to from 600 Torr to 900 Torr with said inert gas being introduced in the increased flow rate and leaving said substrate with the internal pressure being maintained at the adjusted pressure.

5. The method of manufacturing a semiconductor device as claimed in claim 2 wherein, in the step of increasing the flow rate of said inert gas, the flow ratio of said inert gas to said ammonia (NH$_3$) is set to 2:1.

6. The method of manufacturing a semiconductor device as claimed in claim 2 wherein said inert gas is one of Nitrogen (N$_2$), Helium (He) and Argon (Ar).

7. The method of manufacturing a semiconductor device as claimed in claim 2 wherein said buffer layer is composed of GaN.

8. The method of manufacturing a semiconductor device as claimed in claim 2 wherein said buffer layer is composed of AlaGal-aN (0≦a≦1).

9. The method of manufacturing a semiconductor device as claimed in claim 2 wherein said gas containing the Group III element is composed of an organic metal gas.

10. The method of manufacturing a semiconductor device as claimed in claim 1 wherein the step of forming said buffer layer is performed by introducing hydrogen (H$_2$) and an inert gas into said vacuum chamber as a carrier gas in order that hydrogen is introduced in excess of the inert gas, and wherein the method further comprises the step of forming a buffer layer by introducing ammonia (NH$_3$) and a gas comprising a Group III element in addition to the carrier gas.

11. The method of manufacturing a semiconductor device as claimed in claim 1 wherein at least one of said n-type contact layer, said the n-type cladding layer, said the active layer, said the p-type cladding layer and said the p-type contact layer is represented by formula In(x)Al(y)Ga(1−x−y)N(x+y≧1, 0≦x≦1, 0≦y≦1).

12. The method of manufacturing a semiconductor device as claimed in claim 11 wherein the step of cooling said substrate by itself comprises a step of adjusting the internal pressure of said vacuum chamber to from 600 Torr to 900 Torr with said inert gas being introduced in the increased flow rate and leaving said substrate with the internal pressure being maintained at the adjusted pressure.

13. The method of manufacturing a semiconductor device as claimed in claim 11 wherein, in the step of increasing the flow rate of said inert gas, the flow ratio of said inert gas to said ammonia ($NH_3$) is set to 2:1.

14. The method of manufacturing a semiconductor device as claimed in claim 11 wherein said inert gas is one of Nitrogen ($N_2$), Helium (He) and Argon (Ar).

15. The method of manufacturing a semiconductor device as claimed in claim 11 wherein said buffer layer is composed of GaN.

16. The method of manufacturing a semiconductor device as claimed in claim 11 wherein said buffer layer is composed of $Al_aGa_{1-a}N$ ($0 \leq a \leq 1$).

17. The method of manufacturing a semiconductor device as claimed in claim 11 wherein said gas containing the Group III element is composed of an organic metal gas.

18. The method of manufacturing a semiconductor device as claimed in claim 1 wherein the step of cooling said substrate by itself comprises a step of adjusting the internal pressure of said vacuum chamber to from 600 Torr to 900 Torr with said inert gas being introduced in the increased flow rate and leaving said substrate with the internal pressure being maintained at the adjusted pressure.

19. The method of manufacturing a semiconductor device as claimed in claim 1 wherein, in the step of increasing the flow rate of said inert gas, the flow ratio of said inert gas to said ammonia ($NH_3$) is set to 2:1.

20. The method of manufacturing a semiconductor device as claimed in claim 1 wherein said inert gas is one of Nitrogen ($N_2$), Helium (He) and Argon (Ar).

21. The method of manufacturing a semiconductor device as claimed in claim 1 wherein said buffer layer is composed of GaN.

22. The method of manufacturing a semiconductor device as claimed in claim 1 wherein said buffer layer is composed of $Al_aGa_{1-a}N$ ($0 \leq a \leq 1$).

23. The method of manufacturing a semiconductor device as claimed in claim 1 wherein said gas containing the Group III element is composed of an organic metal gas.

* * * * *